(12) United States Patent
Lin et al.

(10) Patent No.: US 10,698,168 B1
(45) Date of Patent: Jun. 30, 2020

(54) PRINTED CIRCUIT BOARD ASSEMBLY (PCBA) WITH INTEGRATED MOUNTING STRUCTURE TO ALIGN AND COUPLE TO TRANSMITTER OPTICAL ASSEMBLY (TOSA) MODULES

(71) Applicant: Applied Optoelectronics, Inc., Sugar Land, TX (US)

(72) Inventors: Kai-Sheng Lin, Sugar Land, TX (US); Yi Wang, Katy, TX (US); Ziliang Cai, Richmond, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 16/239,197

(22) Filed: Jan. 3, 2019

(51) Int. Cl.
*G02B 6/42* (2006.01)
*H01S 5/022* (2006.01)

(52) U.S. Cl.
CPC ......... *G02B 6/4228* (2013.01); *G02B 6/4246* (2013.01); *G02B 6/4256* (2013.01); *G02B 6/4281* (2013.01); *H01S 5/02236* (2013.01); *H01S 5/02288* (2013.01)

(58) Field of Classification Search
CPC .. G02B 6/4228; G02B 6/4246; G02B 6/4256; G02B 6/4281; H01S 5/02288; H01S 5/02236
See application file for complete search history.

(56) References Cited

U.S. PATENT DOCUMENTS

2017/0357064 A1* 12/2017 Nagarajan .............. H04B 10/40

* cited by examiner

*Primary Examiner* — Ryan A Lepisto
*Assistant Examiner* — Erin D Chiem
(74) *Attorney, Agent, or Firm* — Grossman Tucker Perreault & Pfleger, PLLC; Norman S. Kinsella

(57) ABSTRACT

The present disclosure is generally directed to an optical transceiver module that includes a mounting section for aligning and coupling to associated TOSA modules. In particular, an embodiment of the present disclosure includes TOSA and ROSA components disposed on a printed circuit board assembly (PCBA). The PCBA includes a plurality of grooves at a optical coupling end to provide a TOSA mounting section. Each of the grooves provides at least one mating surface to receive and couple to an associated TOSA module. Opposite the optical coupling end, the PCBA includes an electric coupling section for coupling to, for example, a transmit (RX) circuit that provides one or more electrical signals to drive TOSA modules coupled to the TOSA mounting section.

20 Claims, 14 Drawing Sheets

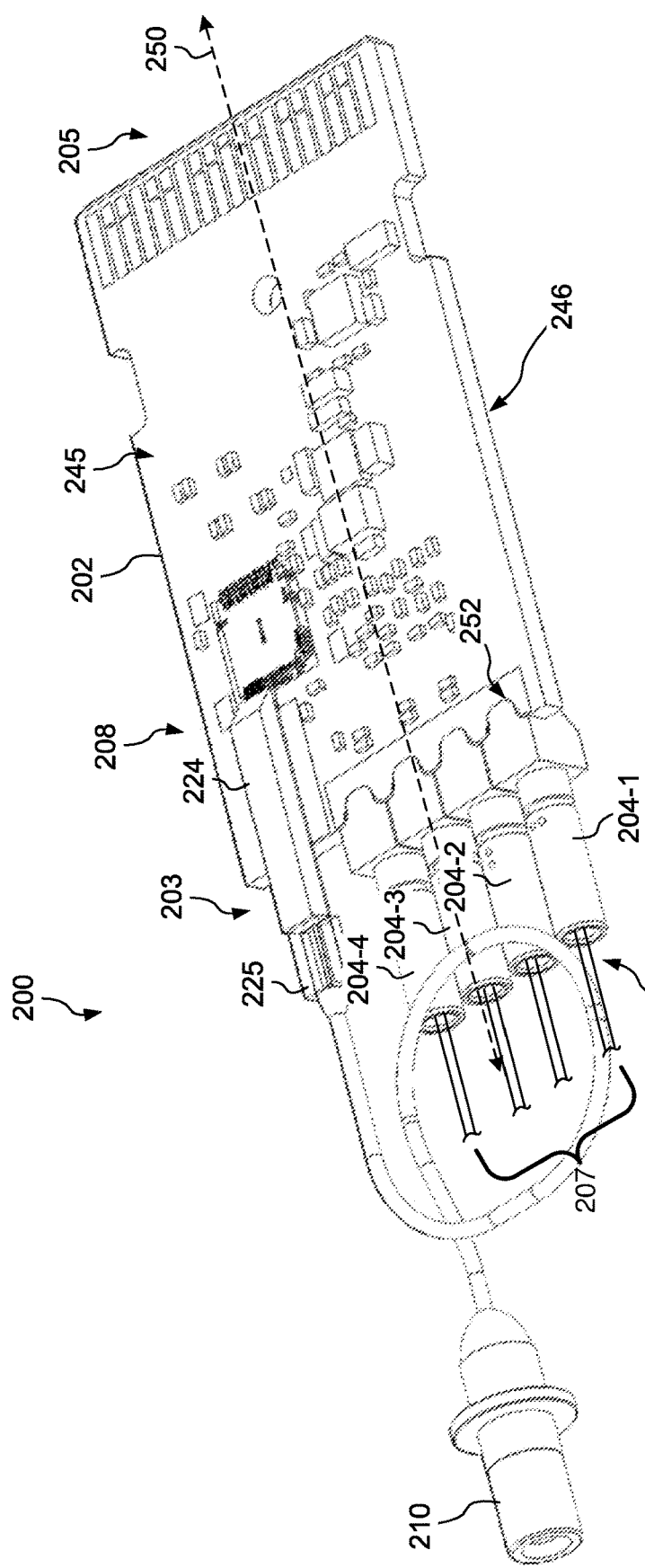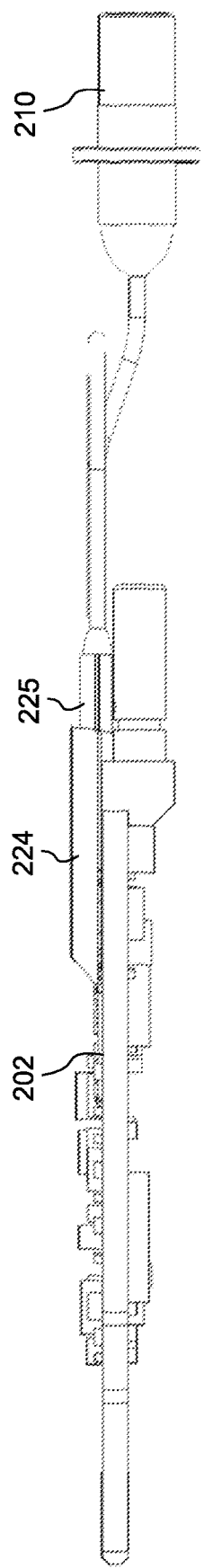
FIG. 2
FIG. 3

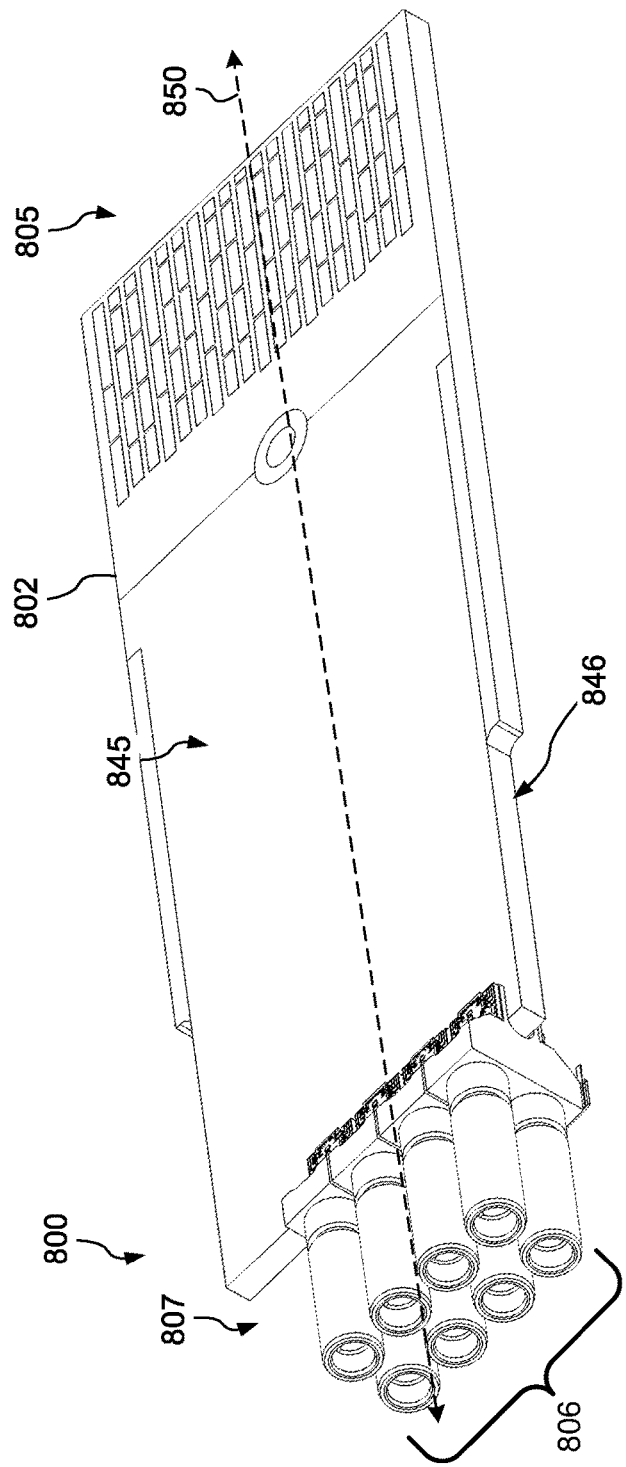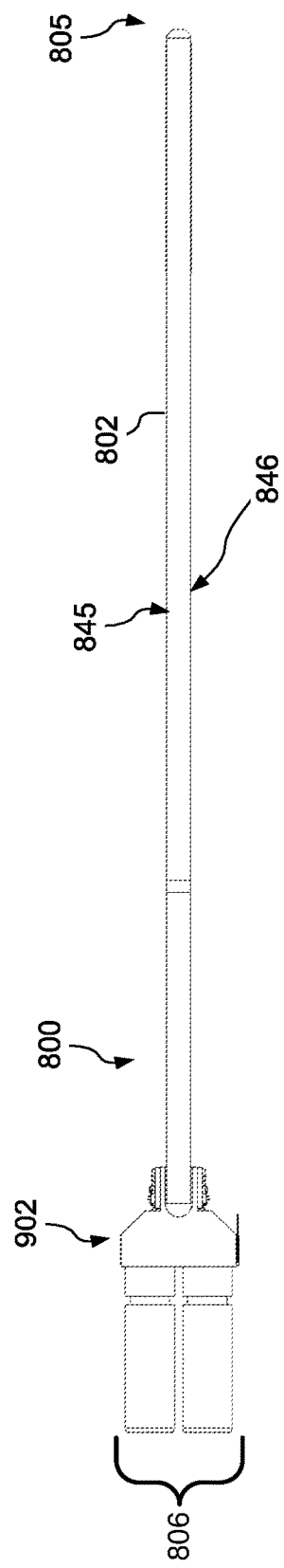
FIG. 8A
FIG. 8B

PRINTED CIRCUIT BOARD ASSEMBLY (PCBA) WITH INTEGRATED MOUNTING STRUCTURE TO ALIGN AND COUPLE TO TRANSMITTER OPTICAL ASSEMBLY (TOSA) MODULES

TECHNICAL FIELD

The present disclosure relates to optical communication devices, and more particularly, to a printed circuit board assembly (PCBA) with mounting section that is configured to align and couple to transmitter optical subassembly (TOSA) modules.

BACKGROUND INFORMATION

Optical transceivers are used to transmit and receive optical signals for various applications including, without limitation, internet data center, cable TV broadband, and fiber to the home (FTTH) applications. Optical transceivers provide higher speeds and bandwidth over longer distances, for example, as compared to transmission over copper cables. The desire to provide higher speeds in smaller optical transceiver modules for a lower cost has presented challenges, for example, with respect to thermal management, insertion loss, and manufacturing yield.

Optical transceiver modules generally include one or more transmitter optical subassemblies (TOSAs) for transmitting optical signals and one or more receiver optical subassemblies (ROSAs) for receiving optical signals. In general, TOSAs include one or more lasers to emit one or more channel wavelengths and associated circuitry for driving the lasers, i.e., to convert electrical signals to channel wavelengths. On the other hand, ROSAs include a demultiplexer and one or more lenses for receiving an optical signal having multiple channel wavelengths to convert the same into proportional electrical signals. Existing configurations of optical transceivers include use of TOSAs and ROSAs with separate housings to support transmitting and receiving operations, respectively. In addition, the separate TOSA and ROSA housings may be coupled to receive and transmit circuitry via, for instance, flexible printed circuit boards and printed circuit assemblies (PCBAs).

BRIEF DESCRIPTION OF THE DRAWINGS

These and other features and advantages will be better understood by reading the following detailed description, taken together with the drawings wherein:

FIG. 2 is a perspective view of a multi-channel optical transceiver module for use in the multi-channel optical transceiver of FIG. 1, in accordance with an embodiment of the present disclosure.

FIG. 3 is a side view of the multi-channel optical transceiver module of FIG. 2, in accordance with an embodiment of the present disclosure.

FIGS. 8A-8E collectively show another embodiment of an example transceiver module consistent with the present disclosure.

DETAILED DESCRIPTION

Figure 1:
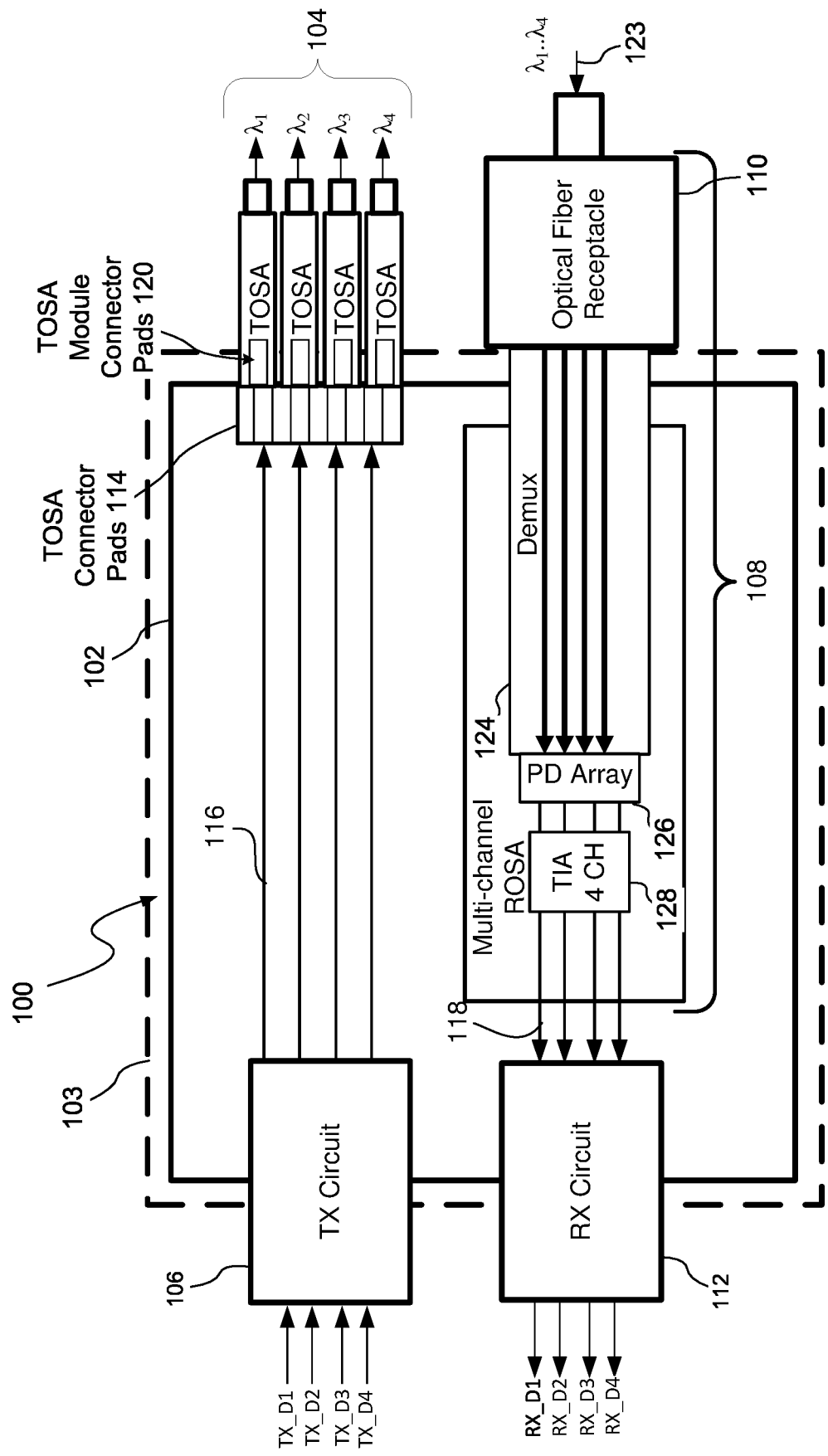
FIG. 1 is a block diagram of a multi-channel optical transceiver, consistent with embodiments of the present disclosure.

The present disclosure is generally directed to an optical transceiver module that includes a mounting section for aligning and coupling to associated TOSA modules, which may be referred to herein as simply laser assemblies. In particular, an embodiment of the present disclosure includes TOSA and ROSA components disposed on a printed circuit board assembly (PCBA). The PCBA includes a plurality of grooves at a optical coupling end to provide a TOSA mounting section. Each of the grooves provides at least one mating surface to receive and couple to an associated TOSA module. Opposite the optical coupling end, the PCBA includes an electric coupling section for coupling to, for example, a transmit (RX) circuit that provides one or more electrical signals to drive TOSA arrangements coupled to the TOSA mounting section.

In an embodiment, each TOSA module (or laser assembly) includes a base with a male coupling section having a generally arcuate shape that corresponds with the grooves at the optical coupling end of the PCBA. Alternatively, each TOSA module may include male coupling section having a substantially "I" beam shape defined by a web (or vertical section), and top and bottom flanges. The web may be tapered or otherwise dimensioned to be received by and couple to an associated groove of the PCBA with the top and bottom flanges acting as stops to prevent travel of the TOSA module once inserted into an associated groove. In either case, the male coupling section includes a plurality of mating surfaces for coupling to and being supported by the grooves of the PCBA. The embodiments for a TOSA module disclosed herein, in a general sense, provide a tongue-and-groove arrangement that permits each TOSA module to easily self-align into an associated groove/slot for purposes of coupling the same to electrical terminals of the PCBA during assembly.

Each TOSA module base further includes a laser arrangement that includes, for example, a laser diode driver (LDD), laser diode (LD), monitor photodiode, filtering capacitor(s), and focusing lens. The components of the laser arrangement may be disposed coaxially, or substantially coaxially and be aligned with a longitudinal center line of an optical coupling receptacle disposed at one end of the TOSA module base. Each TOSA module may support a single laser arrangement, or a dual-laser arrangement, whereby each TOSA module base includes two separate laser arrangements, each laser arrangement having a separate LDD, LD, monitor photodiode, focus lens and optical coupling receptacle.

Accordingly, an optical transceiver module consistent with the present disclosure has numerous advantages over other approaches that edge-mount laser assemblies to circuit boards by simply abutting one end of each laser assembly to an edge of the circuit board. This approach requires properly aligning each TOSA module along the X, Y and Z axis to ensure the TOSA module is in a correct location before securing via wire bonding or other fixation method. An incorrect placement, even by a few microns, can require re-alignment and reattachment, which can ultimately reduce yield. In addition, existing approaches generally include up to four TOSA modules, e.g., 4-channels, for each optical transceiver module. An embodiment of the present disclosure includes a dual-laser arrangement whereby each groove of a PCBA can couple to a single TOSA module base that provides two separate laser arrangements capable of emitting different or similar channel wavelengths. The dual laser arrangement may therefore increase channel density for a transceiver module, e.g., by a factor of 2, as each PCBA can couple to and support greater than four (4) channels.

As used herein, "on-board" in the context of a ROSA arrangement includes direct or indirect coupling of ROSA components to a common substrate. The components of the ROSA arrangement may be coupled to the same surface, or different surfaces of the same substrate. Likewise, the TOSA components may be coupled to the same or different surfaces of the substrate. In some cases, the substrate may include multiple pieces/segments, and this disclosure is not intended to be limited to a single substrate.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. This disclosure is equally applicable to coarse wavelength division multiplexing (CWDM). In one specific example embodiment, the channel wavelengths are implemented in accordance with local area network (LAN) wavelength division multiplexing (WDM), which may also be referred to as LWDM. The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals.

The term substantially, as generally referred to herein, refers to a degree of precision within acceptable tolerance that accounts for and reflects minor real-world variation due to material composition, material defects, and/or limitations/peculiarities in manufacturing processes. Such variation may therefore be said to achieve largely, but not necessarily wholly, the stated characteristic. To provide one non-limiting numerical example to quantify "substantially," minor variation may cause a deviation of up to and including ±5% from a particular stated quality/characteristic unless otherwise provided by the present disclosure.

Referring to the Figures, FIG. 1 illustrates an optical transceiver module 100, consistent with embodiments of the present disclosure. The optical transceiver module 100 is shown in a highly simplified form for clarity and ease of explanation and not for purposes of limitation. In this embodiment, the optical transceiver module 100 transmits and receives four (4) channels using four different channel wavelengths ($\lambda 1$, $\lambda 2$, $\lambda 3$, $\lambda 4$) and may be capable of transmission rates of at least about 25 Gbps per channel. In one example, the channel wavelengths $\lambda 1$, $\lambda 2$, $\lambda 3$, $\lambda 4$ may be 1270 nm, 1290 nm, 1310 nm, and 1330 nm, respectively. Other channel wavelengths are within the scope of this disclosure including those associated with local area network (LAN) wavelength division multiplexing (WDM). The optical transceiver 100 may also be capable of transmission distances of 2 km to at least about 10 km. The optical transceiver 100 may be used, for example, in internet data center applications or fiber to the home (FTTH) applications.

In an embodiment, the optical transceiver module 100 is disposed in a transceiver housing 103. The transceiver housing 103 can be configured with one or more cavities to receive one or more optical transceiver modules, depending on a desired configuration.

The optical transceiver module 100 may include a number of components to support transceiver operations. The optical transceiver module 100 may include an optical transceiver substrate 102, a plurality of transmitter optical subassemblies (TOSA) modules 104 for transmitting optical signals having different channel wavelengths, transmit connecting circuit 106, a multi-channel receiver optical subassembly (ROSA) arrangement 108 for receiving optical signals on different channel wavelengths, an optical fiber receptacle 110 to receive and align a fiber connector (e.g., a ferrule) with the ROSA, and a receiver connecting circuit 112.

The optical transceiver substrate 102 includes traces, connector pads, and other circuitry to support transceiver operations. The optical transceiver substrate 102 may include TOSA connector pads 114 (or terminals 114) that enable each of the TOSA modules 104 to mount and electrically couple to the optical transceiver substrate 102. The optical transceiver substrate 102 may include traces 116 that couple the TOSA connector pads 114 to the transmit connecting circuit 106. The optical transceiver substrate 102 may include traces 118 that electrically couple the ROSA arrangement 108 to the receiver connecting circuit 112. The optical transceiver substrate 102 may provide an optical transceiver module that may be "plugged" into an optical transceiver cage. Therefore, the transmit connecting circuit 106 and the receiver connecting circuit 112 may electrically couple to external circuitry of the optical transceiver cage. The optical transceiver substrate 102 may be manufactured from a multi-layer printed circuitry board (PCB), although other types of substrates may be utilized and are within the scope of this disclosure. One example embodiment of the optical transceiver substrate implemented as a printed circuit board assembly (PCBA) is discussed in further detail below.

Each of the TOSA modules 104 may be configured to receive driving electrical signals (TX_D1 to TX_D4), convert the electrical signals to a multiplexed optical signal (e.g., a signal with channel wavelengths $\lambda 1 \ldots \lambda n$) and output the same to a multiplexer (not shown). Each of the TOSA modules 104 may be electrically coupled to the TOSA connector pads 114 and to the traces 116 through TOSA module connector pads 120. Each of the TOSA modules 104 may include a laser diode device and supporting circuitry. The laser diode devices of the TOSA modules 104 may include distributed feedback lasers (DFBs), Vertical External-cavity Surface-emitting lasers (VECSEL) or other suitable laser devices. In an embodiment, the TOSA modules 104 include a male coupling end to couple into grooves/slots of an associated transceiver module substrate, as discussed below.

As further in shown FIG. 1, the multi-channel ROSA arrangement 108 includes an optical demultiplexer 124, a photodetector array 126 (e.g., photodiodes), and a transimpedance amplifier (TIA) 128 or amplification circuit 128 for amplifying and converting optical signals into electrical signals. The multi-channel ROSA arrangement 108 may be disposed on the substrate 102 in an on-board configuration, whereby each component is coupled to and supported by the substrate 102. This departs from existing ROSA approaches which utilize a separate and distinct housing, often formed from metal, that includes a cavity for receiving filters/ mirrors and other active/passive components for demultiplexing a multi-channel optical signal into constituent channel wavelengths.

Referring to FIGS. 2-6, an example embodiment of an example optical subassembly module 200 is shown consistent with the present disclosure. As shown, the optical subassembly module 200 includes a substrate 202. The substrate 202 may be implemented as the substrate 102 as discussed above with regard to FIG. 1. The substrate 202 includes a first end 203 that extends to a second end 205 along a longitudinal axis 250. The substrate 202 further includes at least a first mounting surface 245 disposed opposite a second mounting surface 246. A ROSA arrangement 208 is disposed on the first mounting surface 245 proximate the first end 203 and includes an on-board or integrated configuration. In the embodiment of FIG. 2, the ROSA arrangement 208 includes a demultiplexer 224, e.g., an arrayed waveguide grating, an optical input port 225, and an optical coupling receptacle 210. One embodiment of the ROSA arrangement 208 is disclosed and described in greater detail in the co-pending U.S. patent application Ser. No. 16/142,466 titled "Receiver Optical Subassembly (ROSA) Integrated on Printed Circuit Board Assembly (PCBA)", which is incorporated herein in its entirety.

Continuing on, a TOSA arrangement 206 is coupled to at least the second mounting surface 246 proximate the first end of the substrate 202 and adjacent the ROSA arrangement 208. As discussed in greater detail below, the TOSA arrangement 206 can include mating surfaces for directly coupling to and being supported by the second mounting surface 246. The TOSA arrangement 206 includes a plurality of laser assemblies, 206-1 to 206-4, configured to launch a plurality of associated channel wavelengths ($\lambda_1$-$\lambda_4$) on to external transmit optical waveguides 207, e.g., optical fibers. As shown, each of the laser assemblies 206-1 to 206-4 include a base that allows for edge mounting via an associated groove of the plurality of grooves 252 provided by the optical coupling end 203 of the substrate 202, which will be discussed in further detail below. The plurality of grooves 252 may also be referred to as a TOSA mounting section. The grooves 252 may be formed by the substrate 202, and thus, the grooves 252 and substrate 202 may be a single piece. However, this disclosure is not limited in this regard and the substrate 202 and grooves 252 may be different pieces.

Figure 4:
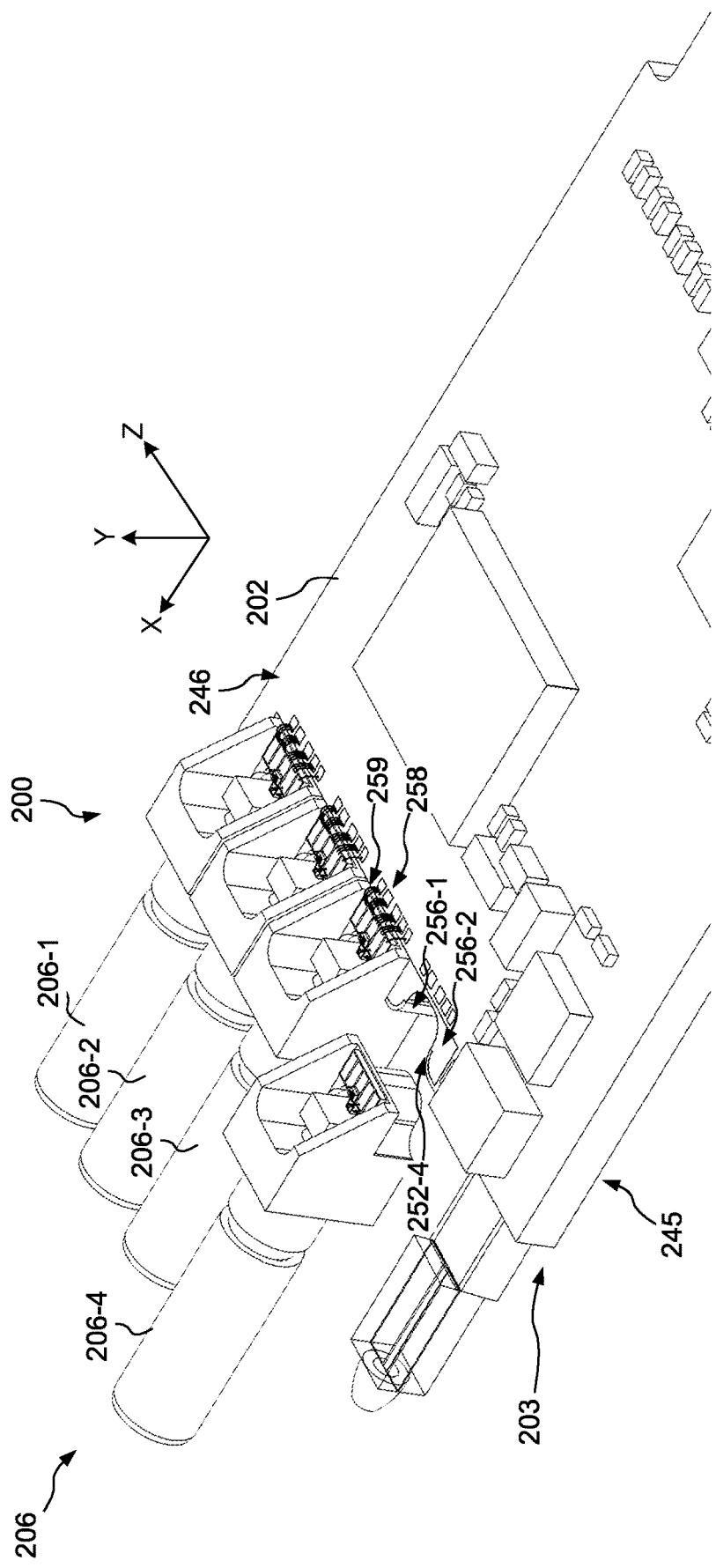
FIG. 4 shows a perspective view of a transceiver module consistent with an embodiment of the present disclosure.
Figure 5:
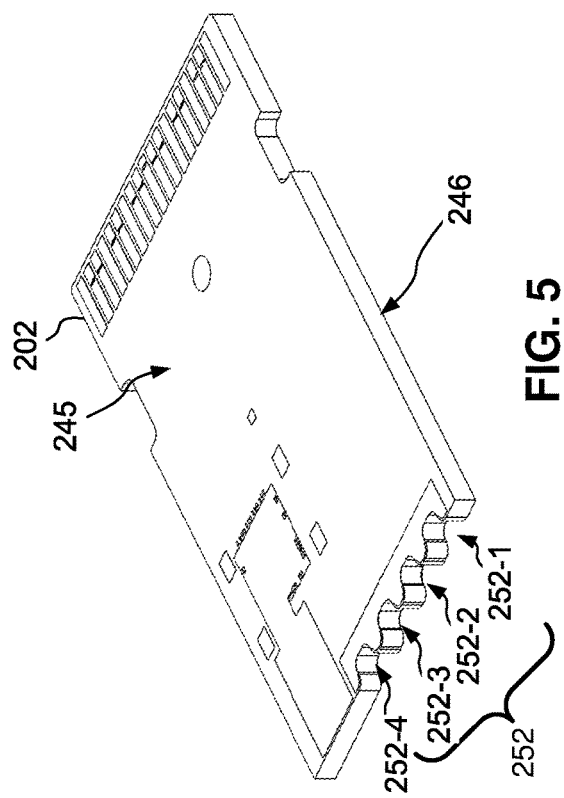
FIG. 5-6 collectively show an example substrate suitable for use in the transceiver module of FIG. 4, in accordance with an embodiment.
Figure 6:
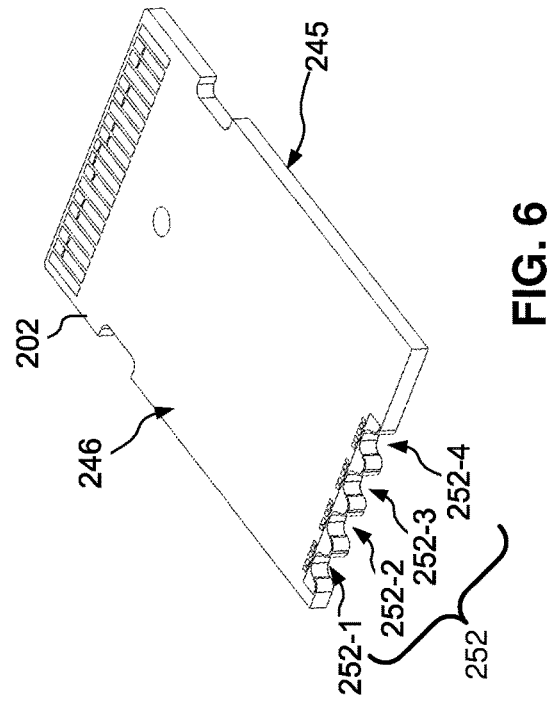

With specific reference to FIGS. 4-6, the substrate 202 may comprise, for example, a printed circuit board assembly (PCBA), such as shown, or other suitable substrate configuration. The optical coupling end 203 of the substrate 202 defines a plurality of grooves 252 which may also be referred to as notches. The grooves shown collectively as 252 and individually as 252-1 to 252-4 may be evenly spaced relative to each other to allow for the laser assemblies 206-1 to 206-4 to be disposed relatively close in proximity to each other. Each of the plurality of grooves 252 provide a female portion for mating and coupling to corresponding male portions of each of the laser assemblies 206-1 to 206-4. This allows the plurality of grooves 252 and laser assemblies 206-1 to 206-4 to form a tongue and groove arrangement. In some cases, the substrate 202 may provide male ends for mating to a female end of each of the laser assemblies 204-1 to 204-4, so the embodiment of FIG. 4 should not be construed as limiting.

In any event, the plurality of grooves 252 may be configured to align each of the laser assemblies along the X, Y and Z axis during assembly of the optical subassembly module 200. Each of the grooves 252 provides at least a first mating surface 256-1 and a second mating surface 256-2 that extend substantially transverse relative to each other. Each of the first and second mating surfaces 256-1 and 256-2 can provide a stop feature that limits travel about the X, Y and Z axis. For example, as shown the laser assembly 204-4 may be aligned and inserted into the associated groove 252-4 such that the male coupling section of the laser assembly 206-4 directly abuts the first mating surface 256-1 defined by the groove 252-4 and directly contacts and is supported by the second mating surface 256-2. Therefore, the first and second mating surfaces 256-1, 256-2 of each of the grooves 252 allow for an associated laser assembly to be easily aligned with, and securely coupled, to the substrate 202. This tongue-and-groove arrangement also aligns each laser assembly with electrical contacts 258 of the substrate 202 for electrical coupling via, for instance, wire bonds 259. Each of the laser assemblies 206-1 to 206-4 may then be attached to the substrate 202 via, for example, welds or other suitable method.

FIGS. 7A-7G collectively show one example of a laser assembly 206-N consistent with an embodiment of the present disclosure. The laser assembly 206-N may also be referred to as a cuboid laser assembly. The laser assembly 206-N includes a base portion 708 or cuboid base portion 708, which may be referred to as simply a base. The base 708 includes an upper portion that includes a notch/cavity 706 defined by sidewalls of the base 708. The cavity 706 provides at least a first mounting surface 709-1 (see FIGS. 7E and 7F). As further shown, a laser diode (LD) sub-mount 710 couples to the first mounting surface 709-1. The LD sub-mount 710 may comprise, for example, a printed circuit board (PCB) with a plurality of traces 714, as shown. A laser diode 712 is mounted on, and electrically couples to, the LD sub-mount 710 by way of wire bonding, for example. The laser diode 712 may comprise an edge emitting diode configured to emit channel wavelengths along an optical path 716 that intersects with one or more passive or active optical components disposed within the base 708 and the optical coupling receptacle 704. For example, as shown in the cross-sectional view of FIG. 7G, the optical path 716 extends through the focus mirror 718, aperture 723, optical isolator 722 and fiber stub 724. This configuration may also be referred to as a colinear arrangement whereby the laser diode 712, monitor photodiode 730, lens 718, aperture 723, and optical coupling receptacle are disposed along a common axis. The optical coupling receptacle 704 may be sized to allow for insertion of a ferrule to allow for optical coupling with a transmit optical waveguide, e.g., an optical fiber.

Figure 7A:
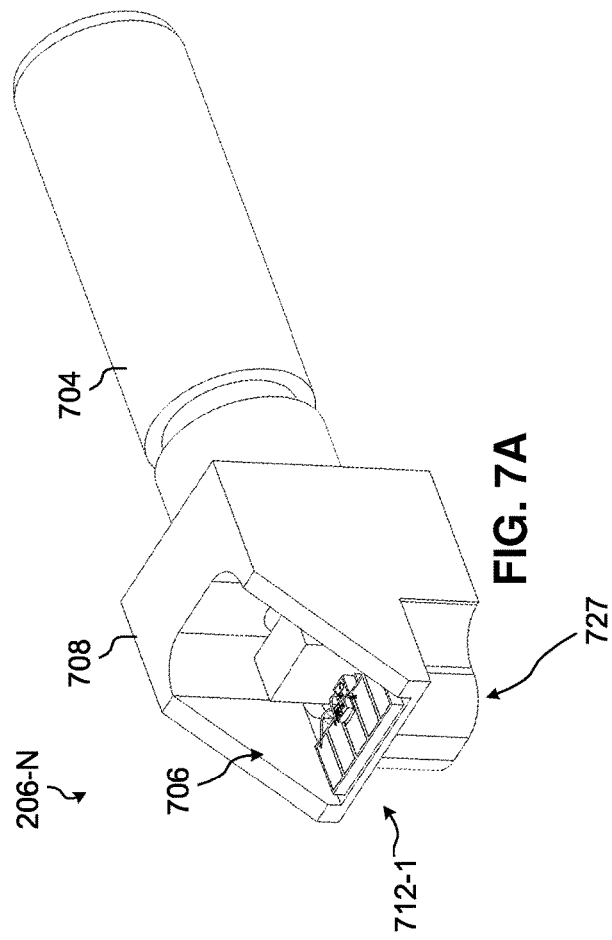
FIGS. 7A-7F collectively show an example TOSA module suitable for use in the transceiver module of FIG. 4, in accordance with an embodiment.
Figure 7B:
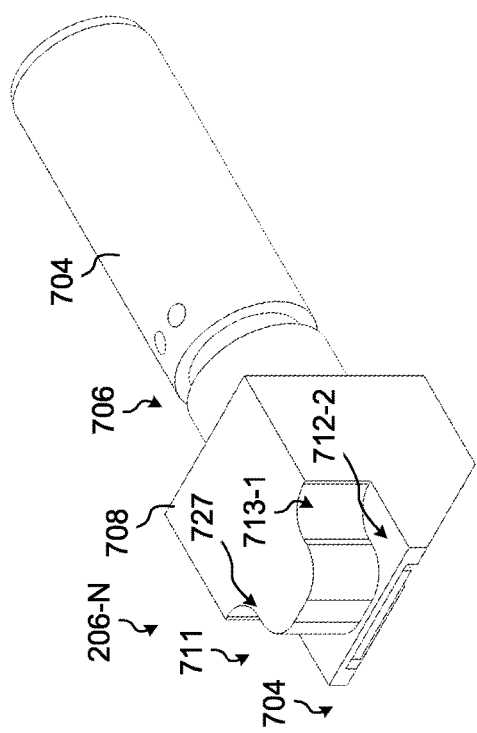
Figure 7C:
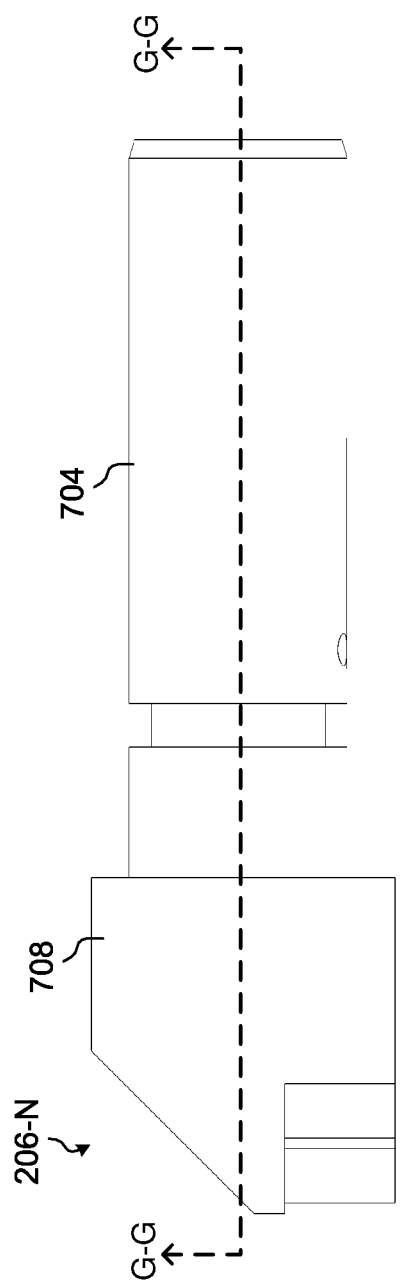
Figure 7D:
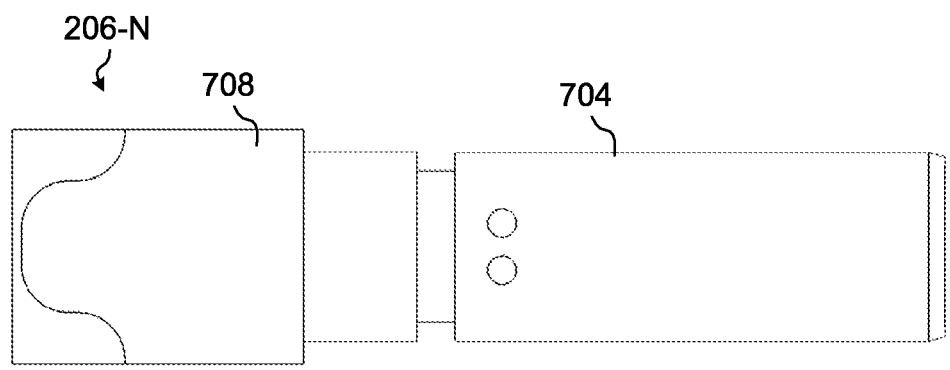
Figure 7E:
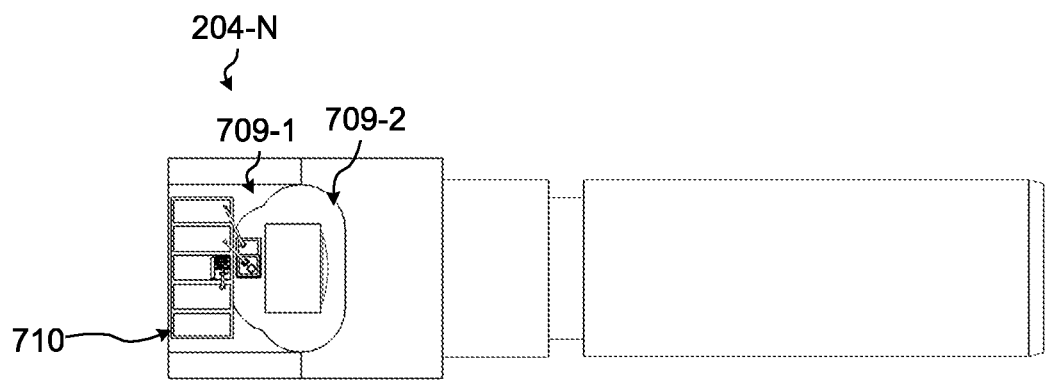

Continuing on, the base 708 of the laser assembly 206-N further includes a lower portion 727 that defines a male coupling section 711 (See FIG. 7B). As shown, the male coupling section 711 includes a generally arcuate profile/ shape that corresponds with the female coupling section defined by the plurality of grooves 252 of the substrate 202. In particular, a first mating surface 713-1 defines the generally arcuate shape and is contoured to generally correspond with the first mating surface 256-1 that defines each of the plurality of grooves 252. Therefore, the male coupling section 711 and the female coupling section, e.g., the grooves 252, of the substrate 202 may form a tongue and groove or "keyed" configuration.

The male coupling section 711 further includes a shoulder that is at least partially defined by a second mating surface 712-2. As previously discussed, each of the laser assemblies can include a portion that rests on the substrate 202, and in particular, the second mating surface 256-2. The second mating surface 712-2 of the laser assembly 206-N may be substantially flat and dimensioned to at least partially allow for direct contact with the second mating surface 256-2 of the substrate 202. To this end, the first mounting surface 245 of the substrate 202 may support at least a portion of the base 708 of the laser assembly 206-N based on the second mating surface 256-2.

Figure 7F:
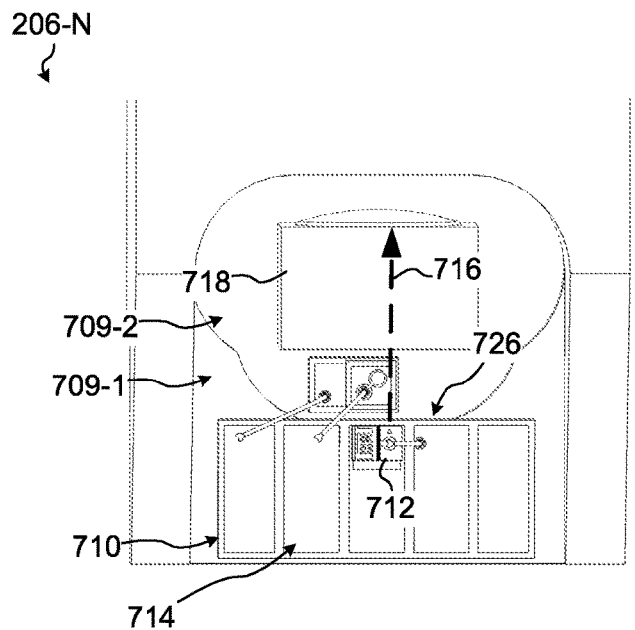
Figure 7G:
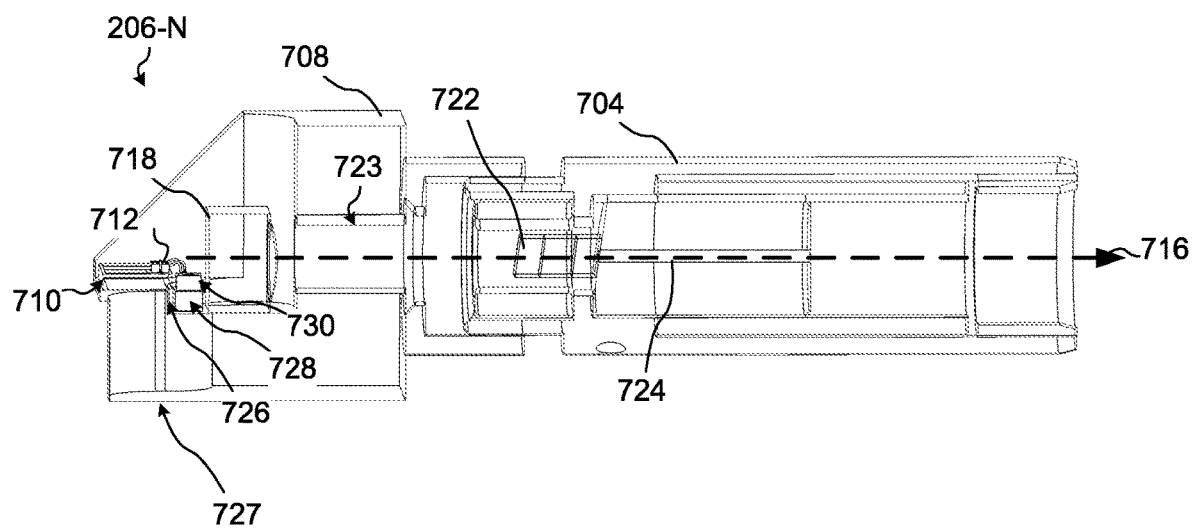
FIG. 7G shows an example cross-sectional view of the TOSA module of FIG. 7C taken along the line G-G.

Continuing on, the laser assembly 206-N further defines a second mounting surface 709-2 within the cavity 706 (See FIG. 7F). The first and second mounting surfaces 709-1, 709-2 may define a step/shoulder based on a surface 726 that extends substantially transverse relative to each of the first and second mounting surfaces 709-1, 709-2 and adjoins the same, which is shown more clearly in FIG. 7G. The surface 726 includes a predefined height that allows a monitor photodiode sub-mount 728 and monitor photodiode 730 to be mounted in a countersunk arrangement whereby the monitor photodiode is disposed between the laser diode 712 and focus lens 718, but does not substantially obstruct channel wavelengths emitted along light path 716. In addition, the countersunk arrangement further allows the light path 716 to intersect with the focus lens 718 substantially at a center of the same.

Note that while the embodiments of FIGS. 5-7G show an arrangement whereby laser assemblies have a male coupling section and the substrate 202 includes a female coupling section, this disclosure is not necessarily limited in this regard. For example, the substrate 202 may include a male coupling section and each laser assembly may include a female coupling section, depending on a desired configuration.

Figure 8C:
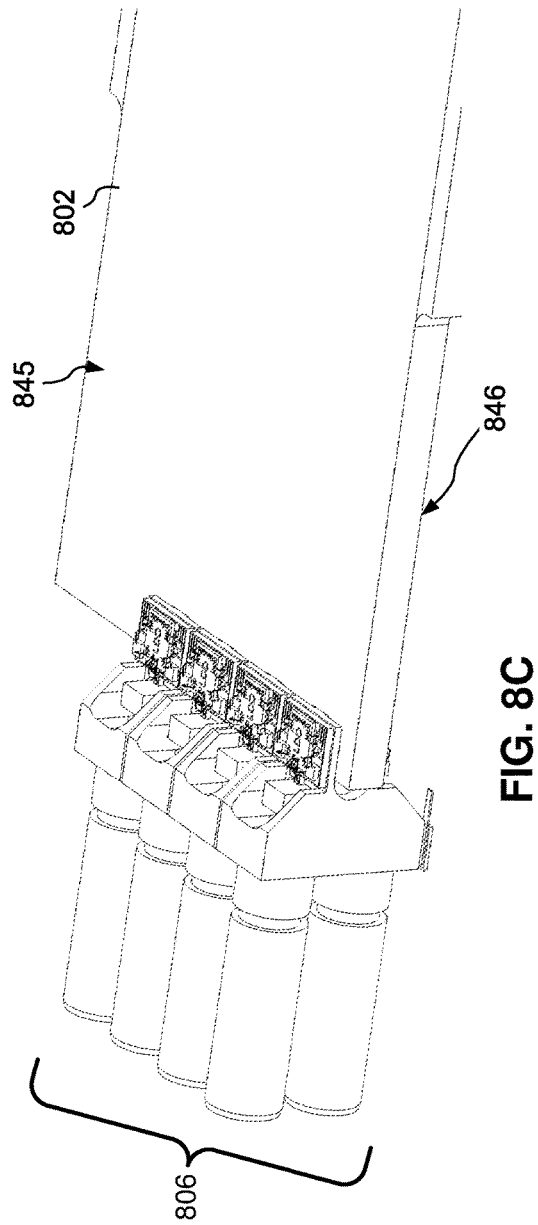
Figure 8D:
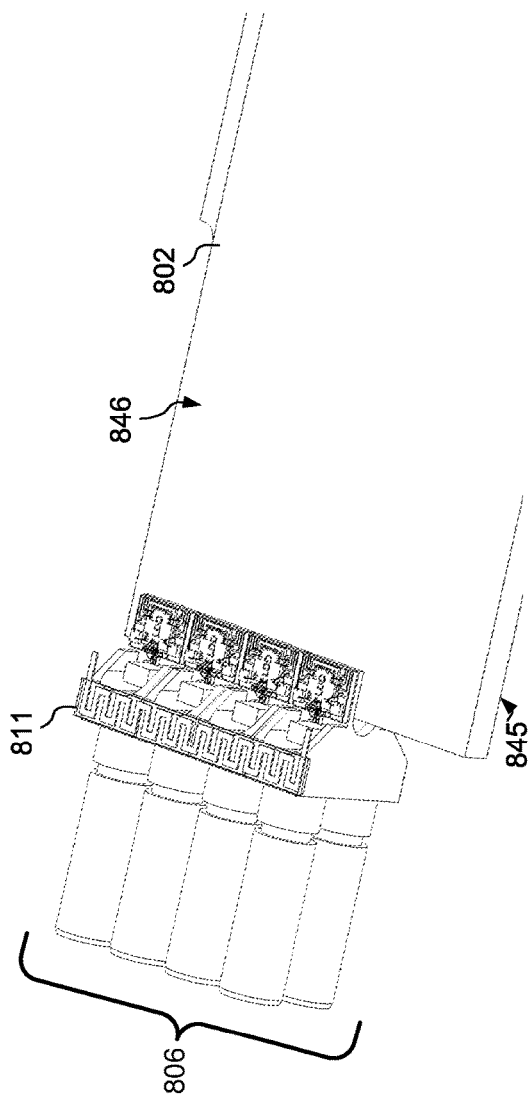
Figure 8E:
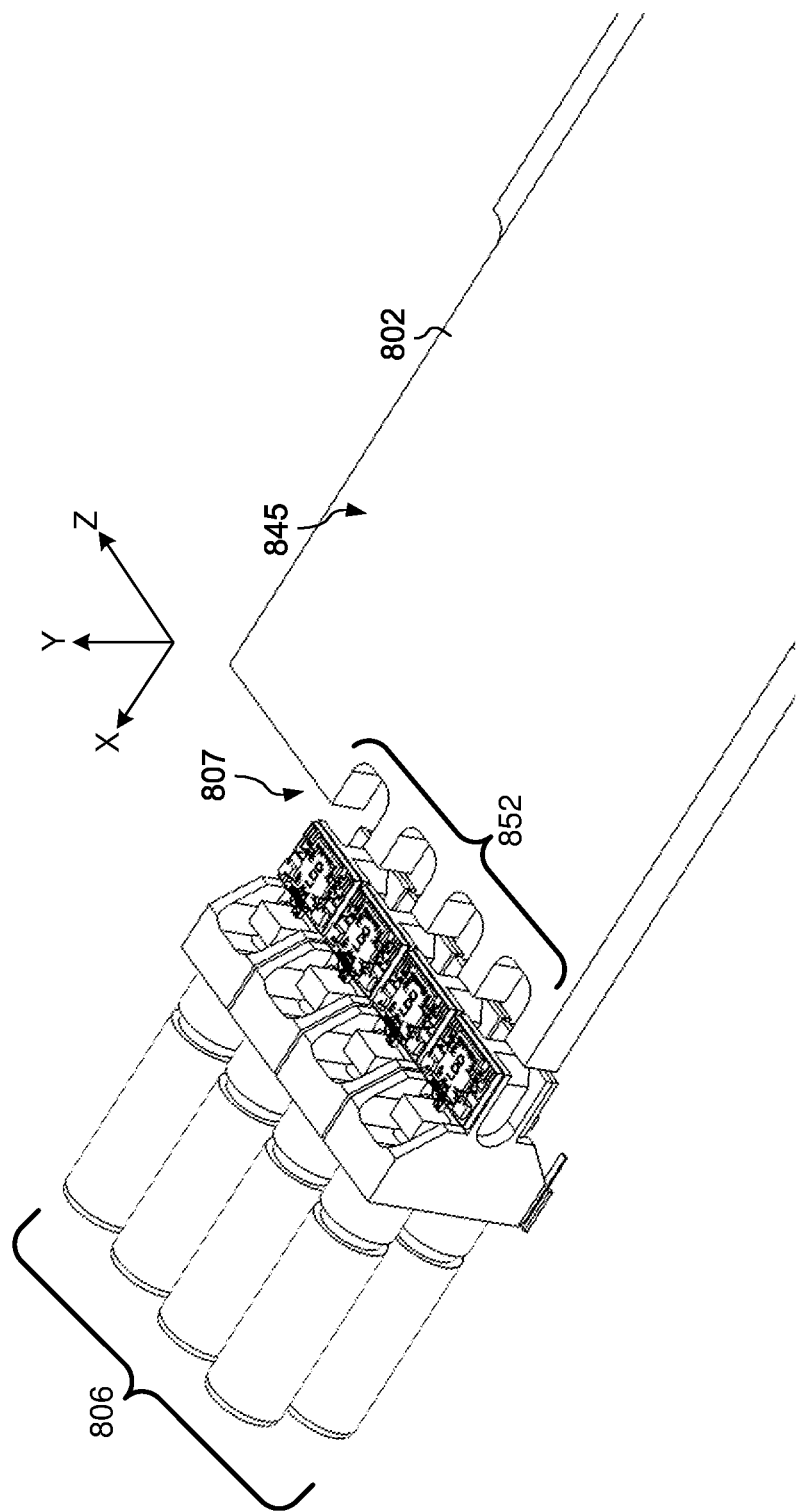

FIGS. 8A-8E collectively show another example of an optical subassembly module 800 in accordance with an embodiment of the present disclosure. As shown, the optical subassembly module 800 includes a substrate 802 that extends from a first end 805 to a second end 807 along a longitudinal axis 850. A plurality of dual laser assemblies 806 are edge mounted to the second end 806. Note that the embodiment shown in FIG. 8A is illustrated without a ROSA arrangement not for purposes of limitation but for reasons of clarity. The optical subassembly module 800 may be configured substantially similar to that of the optical subassembly module 200 discussed above with reference to FIGS. 2-3, and for this reason the description of which will not be repeated for brevity. However, the embodiment of FIG. 8A includes a plurality of dual laser assemblies 804 that provides two 1×4 arrays of dual laser assemblies to provide a total of eight (8) channels. The dual laser assemblies therefore advantageously increasing channel density for the optical subassembly module 800.

In particular, each of the dual laser assemblies 806 include a mounting portion configured to couple into grooves 852 (FIG. 8E) of the substrate 802, which is discussed below in further detail. As further shown, the plurality of dual laser assemblies 806 mount to the first and second mounting surfaces 845, 846 to securely hold the plurality of dual laser assemblies in place. During manufacturing of the optical subassembly module 800, the plurality of laser assemblies 806 may be individually coupled to respective grooves of the plurality of grooves 852 with alignment provided by their respective base portion that provides an interlocking arrangement. The grooves 852 may be disposed at predefined locations and spacing relative to each other to allow for relatively easy alignment along the X, Y and Z axis of associated dual laser assemblies. Notably, the structure of the dual laser assemblies 806 ensures proper alignment about each of the X, Y and Z axis by limiting travel. Accordingly, attachment during manufacture may be performed by simply coupling the dual laser assemblies 806 into grooves 852.

A heating element 811 (FIG. 8D) may be disposed on the plurality of dual laser assemblies 806. The heating element 811 may be utilized to stabilize emitted channel wavelengths by adjusting temperature. The heating element 811 may comprise a coil, as shown, or other suitable device.

Figure 9A:
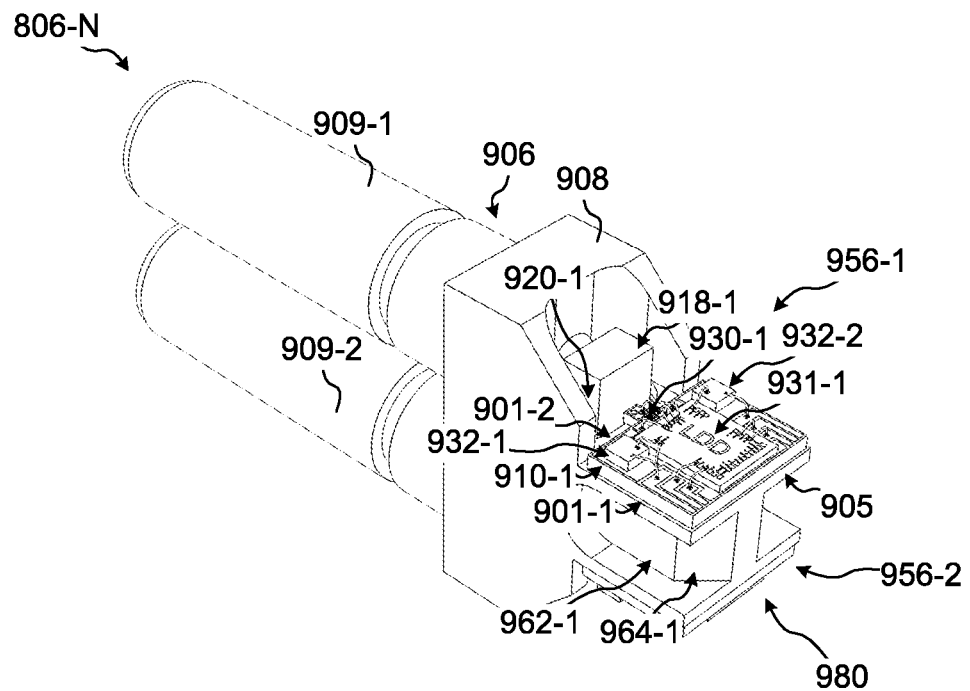
FIGS. 9A-9D collectively show an example dual laser assembly suitable for use in the optical transceiver module of FIG. 8A, in accordance with an embodiment.

FIG. 9A shows an example dual laser assembly 806-N in isolation for ease of description and clarity. As shown, the dual laser assembly 806-N includes a base 908 having a first end 905 that extends to a second end 906. The first end 905 may be electrically coupled to an associated transmit connecting circuit (not shown), and therefore may also be referred to as an electrical coupling end. On the other hand, the second end 906 is proximate optical fiber coupling receptacles 909-1, 909-2, and therefore may be referred to as an optical coupling end.

The base 908 includes at least first and second mounting sections 901-1, 901-2 disposed opposite each other to mount to first and second laser arrangements 956-1, 956-2, respectively. In an embodiment, the first and second mounting sections 901-1, 902-2 and associated laser arrangements may be substantially symmetrical to provide a dual laser arrangement. For instance, the embodiment of FIG. 9D illustrates how the base 908 provides a substantially symmetric profile/shape about the top and bottom portions of the base 908, with the first and second laser arrangements 956-1, 956-2 being substantially mirror images of each other.

Figure 9B:
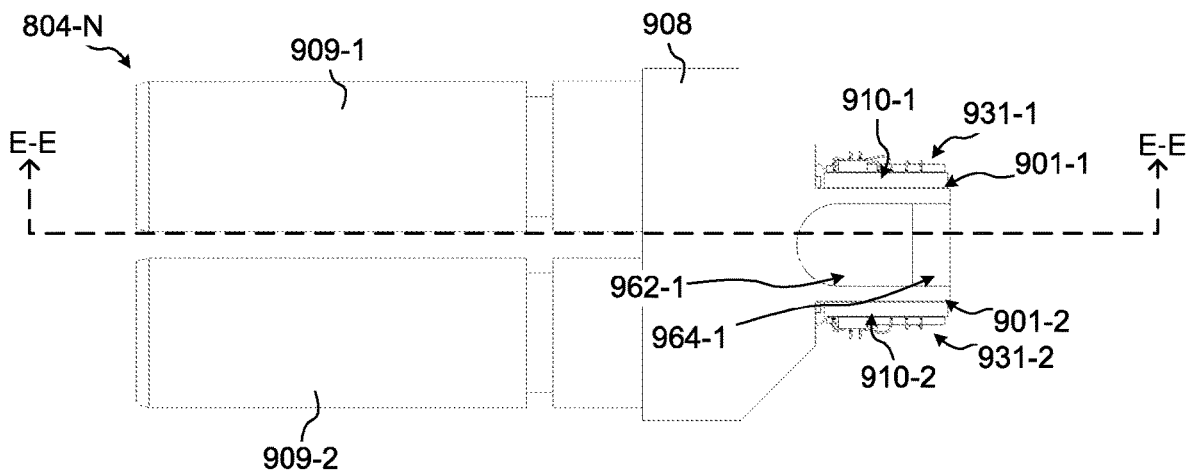
Figure 9C:
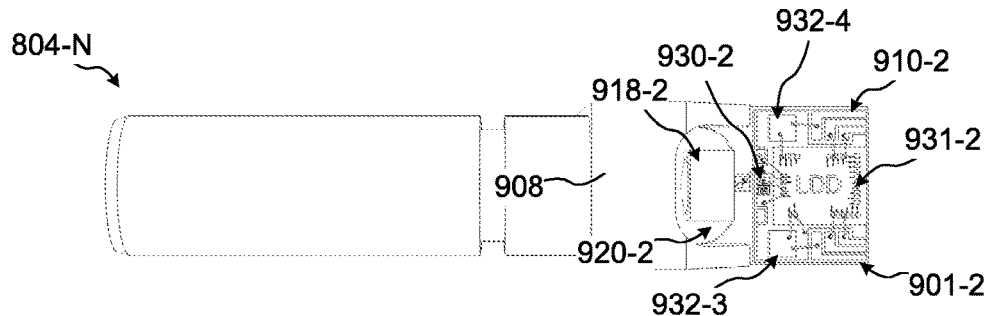
Figure 9D:
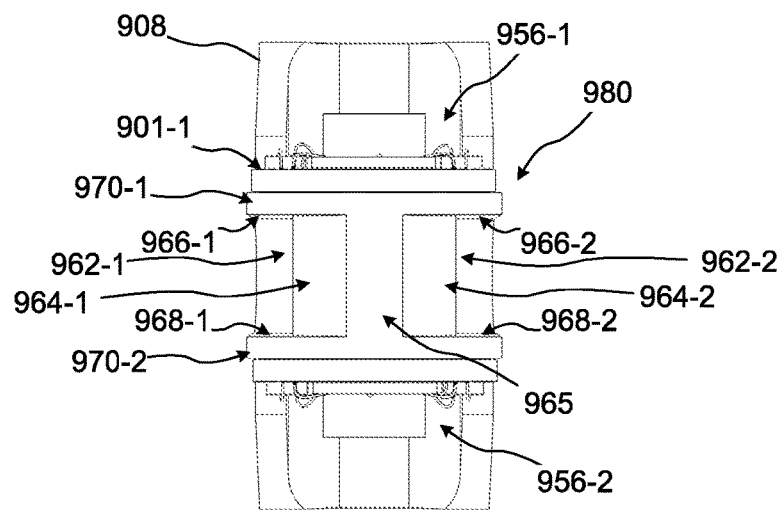

With specific reference to FIGS. 9A-9C, the first laser mounting section 901-1 includes a first mounting surface 910-1 for mounting to active and/or passive optical components that extends parallel with a longitudinal axis of the optical fiber coupling receptacles 909-1, 909-2. As shown, the mounting section 901-1 further includes a laser diode driver (LDD) submount 910-1. The LDD submount 910-1 includes a LDD chip 931-1 mounted and electrically coupled thereto. Likewise, the LDD submount 910-1 includes first and second filtering capacitors 932-1, 932-1 mounted and electrically coupled thereto. The mounting section 901-1 further includes a first laser diode 930-1 mounted to the first mounting surface 901-1 and disposed between the LDD submount 910-1 and the focus lens 918-1. Following the LDD submount 910-1 is a recessed mounting region 920-1. As discussed further below, the recessed mounting section 920-1 provides a countersunk arrangement which allows for the first focus lens 918-1 to have a center substantially aligned with an emission surface/face of the laser diode 930-1.

The second laser mounting section 901-2 includes a first surface 910-2 for mounting to active and/or passive optical components that extends parallel with a longitudinal axis of the optical fiber coupling receptacles 909-1, 909-2. As shown, the second mounting section 901-2 includes a laser diode driver (LDD) submount 910-2. The LDD submount 910-2 includes a LDD chip 931-2 mounted and electrically coupled thereto. Likewise, the LDD submount 910-2 includes first and second filtering capacitors 932-3, 932-4 mounted and electrically coupled thereto. The second laser mounting section 901-2 further includes a laser diode 930-2 mounted to the second mounting surface 901-2 and disposed between the LDD submount 910-2 and the focus lens 918-2. Following the LDD submount 910-2 is a recessed mounting region 920-2. The recessed mounting section 920-2 provides a countersunk arrangement which allows for the second focus lens 918-2 to have a center substantially aligned with an emission surface/face of the laser diode 930-2.

As discussed above, the each dual laser assembly can easily couple into corresponding grooves of the plurality of grooves 952 to mount to the substrate 902. One example mounting section 980 is shown in greater detail in FIGS. 9A, 9B and 9D. With specific reference to FIG. 9D, the mounting section 980 is defined by the base 908 and includes first and second sidewalls 962-1, 962-2, disposed opposite each other. Each of the first and second sidewalls 962-1, 962-2 support the first and second mounting surfaces 901-1, 901-2 and are defined by surfaces that extend substantially transverse relative to the same. The first and second sidewalls 962-1, 962-2 transition to first and second tapered sidewalls 964-1, 964-2, respectively. A mating surface 965 adjoins the first and second tapered sidewalls 964-1, 964-2.

The base 908 may therefore provide a so-called "I" or "EYE" beam shape that includes top and bottom flanges 970-1, 970-2 which are connected by a middle section or web at 965. The taper of the middle section allows the base 908 to self-align into an associated groove of the plurality of grooves 952. The mating surface 965 may therefore directly abut or otherwise be in close proximity to the substrate 902 when the base 908 is inserted into an associated groove. The first and second tapered sidewalls 962-1, 962-2 and/or the first and second sidewalls 964-1, 964-2 may also directly abut the substrate 902 or otherwise be in close proximity, and may therefore may also provide additional mating surfaces to securely hold the dual laser assembly 806-N in an associated groove of the plurality of grooves 952.

Figure 9E:
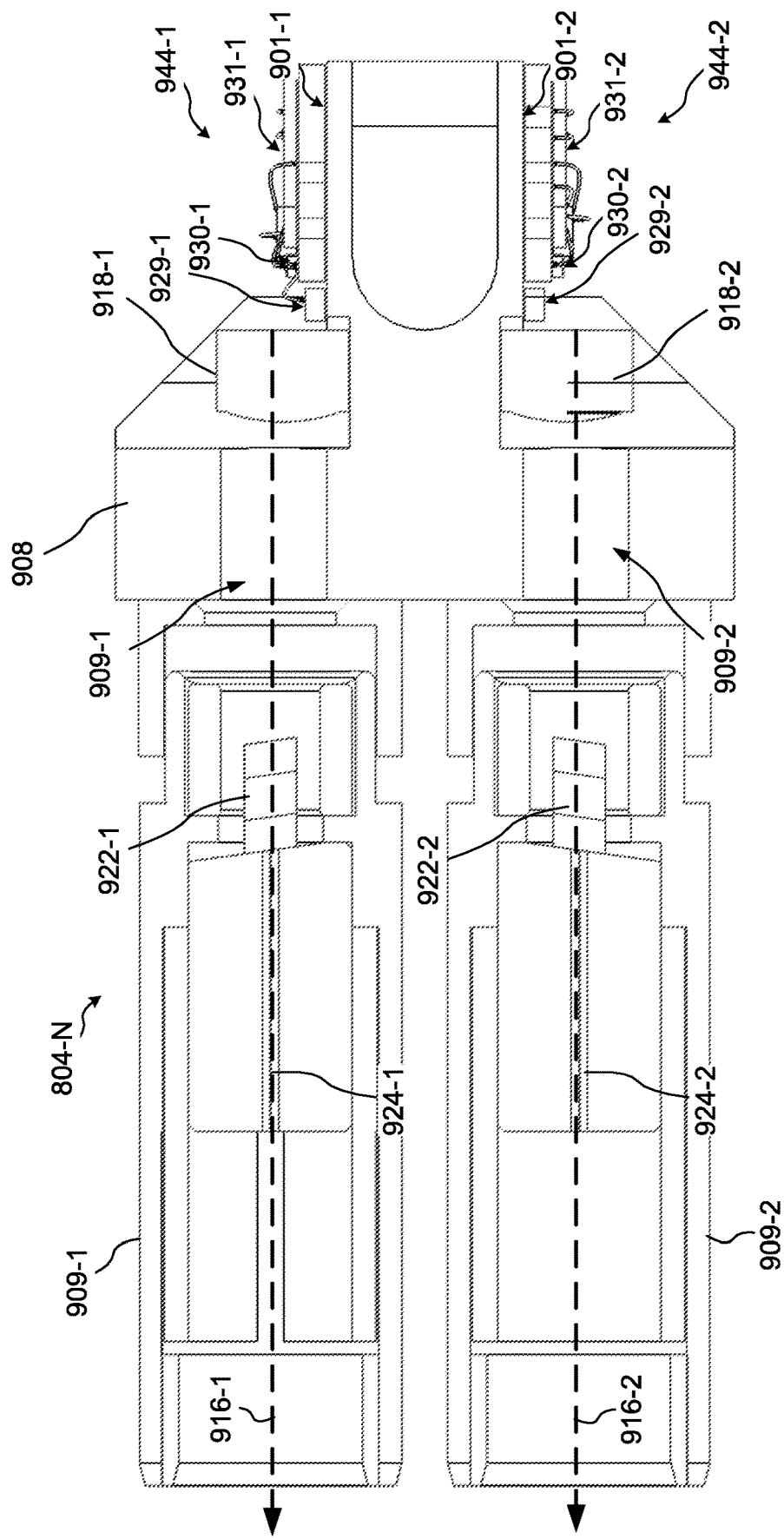
FIG. 9E shows a cross-sectional view of the TOSA module of FIG. 9B taken along line E-E, in accordance with an embodiment.

Turning to FIG. 9E, a cross-sectional view of the dual laser assembly 806-N taken along the line E-E (See FIG. 9B) is shown in accordance with an embodiment. As shown, the first laser mounting section 901-1 includes a first laser arrangement 944-1. The first laser arrangement 944-1 includes a first LDD chip 931-1, first laser diode 930-1, and a first monitor photodiode 929-1. The second laser mounting section 901-2 includes a second laser arrangement 944-2. The second laser arrange 944-2 includes a second LDD chip 931-2, second laser diode 930-2, and a second monitor photodiode 929-2. The first and second laser arrangements 944-1, 944-2 are configured to launch an associated channel wavelength on to first and second optical paths 916-1, 916-2, respectively. The first and second optical paths 916-1, 916-2 may extend substantially parallel to each other and extend through a plurality of active and/or passive optical components before being launched onto, for example, an external transmit fiber. For example, the first optical path 916-1 extends through the first aperture 909-1, a first optical isolator 922-1, and a first fiber stub 924-1. Likewise, the second optical path 916-2 extends through a second aperture 909-2, a second optical isolator 922-2 and a second fiber stub 924-2. The embodiment shown in FIG. 9E may be referred to as a collinear arrangement whereby each of the LDD chip, laser diode, monitor photodiode are disposed along the same axis.

One aspect of the present disclosure includes a laser assembly. The laser assembly comprising a base defined by a plurality of sidewalls, the base comprising at least a first surface for mounting a laser arrangement, an aperture for optically aligning the laser arrangement with an optical coupling receptacle, and a male coupling section defined by at least one sidewall of the plurality of sidewalls, the male coupling section defined by at least a first mating surface that extends substantially transverse relative to the first mounting surface, the male coupling section being shaped to generally correspond with a mating groove of a printed circuit board of an optical transceiver module.

Another aspect of the present disclosure includes an optical transceiver. The optical transceiver comprising a housing defining a cavity for receiving an optical transceiver module, and an optical transceiver module disposed at least partially within the cavity of the housing, the optical transceiver module comprising, a substrate having a first end that extends to a second end, the substrate having at least a first mounting surface, a plurality of mating grooves at the first end of the substrate for coupling to laser assemblies, and a plurality of laser assemblies, each of the plurality of laser assemblies comprising a base that provides at least a first surface for mounting a laser arrangement and a male coupling section, the male coupling section defined by at least a first mating surface that extends substantially transverse relative to the first mounting surface and is shaped to generally correspond with a mating groove of the plurality of mating grooves.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:
1. A laser assembly comprising:
   a base defined by a plurality of sidewalls, the base comprising:
   at least a first surface for mounting a laser arrangement;
   an aperture for optically aligning the laser arrangement with an optical coupling receptacle; and
   a male coupling section defined by at least one sidewall of the plurality of sidewalls, the male coupling section defined by at least a first mating surface that extends substantially transverse relative to the first mounting surface and being shaped to generally correspond with a mating groove defined by an optical coupling end of a printed circuit board of an optical transceiver module to edge mount thereto such that the laser assembly extends from the optical coupling end of the printed circuit board.

2. The laser assembly of claim 1, wherein the base defines a cavity, and wherein the first surface defines a portion of the cavity, and wherein the male coupling section is disposed below the cavity.

3. The laser assembly of claim 1, wherein a laser diode is coupled to the first surface.

4. The laser assembly of claim 3, wherein the laser diode is coupled to the first mounting surface by way of a laser submount, and wherein the laser diode is electrically coupled to the laser submount.

5. The laser assembly of claim 1, wherein the male coupling section comprises a second mating surface that extends substantially transverse relative to the first mating surface, and wherein the second mating surface is configured to be supported by a surface of the printed circuit board when coupled thereto.

6. The laser assembly of claim 1, wherein the laser assembly comprises a laser diode, and wherein the base defines a cavity that includes a focus lens disposed coaxially with the laser diode.

7. The laser assembly of claim 6, wherein a monitor photodiode is disposed below a light path that extends from an emission surface of the laser diode, and wherein the light path is aligned with the focus lens such that channel wavelengths emitted by the laser diode intersect with substantially the center of the focus lens.

8. The laser assembly of claim 7, wherein the aperture is coaxially aligned with the laser diode, and wherein the laser assembly further includes an optical coupling receptacle coupled to the base and aligned with the aperture to allow for the light path to extend from the laser diode through the aperture and into the optical coupling receptacle for optical coupling with a transmit waveguide.

9. The laser assembly of claim 1, wherein the first mating surface comprises a generally arcuate shape.

10. The laser assembly of claim 1, wherein the laser assembly includes a first and second laser arrangements, the first and second laser arrangements being disposed opposite each other on the base and configured to emit different channel wavelengths.

11. The laser assembly of claim 1, wherein the male coupling section includes top and bottom flanges and a vertical section adjoining the top and bottom flanges, and wherein the vertical section is defined at least in part by the first mating surface.

12. The laser assembly of claim 11, wherein the male coupling section further includes a tapered surface that transitions to the vertical section, the tapered surface allowing the laser assembly to self-align when coupling to an associated groove of a transceiver module.

13. An optical transceiver, the optical transceiver comprising:
a housing defining a cavity for receiving an optical transceiver module; and
an optical transceiver module disposed at least partially within the cavity of the housing, the optical transceiver module comprising:
a substrate having a first end that extends to a second end, the substrate having at least a first mounting surface;
a plurality of mating grooves defined by the first end of the substrate for coupling to laser assemblies; and
a plurality of laser assemblies, each of the plurality of laser assemblies comprising:
a base that provides at least a first surface for mounting a laser arrangement and a male coupling section, the male coupling section defined by at least a first mating surface that extends substantially transverse relative to the first mounting surface and is shaped to generally correspond with a mating groove of the plurality of mating grooves.

14. The optical transceiver of claim 13, wherein the male coupling section comprises a second mating surface that extends substantially transverse relative to the first mating surface, and wherein the second mating surface is configured to be supported by a surface of the substrate when coupled thereto.

15. The optical transceiver of claim 14, wherein the laser assembly comprises a laser diode, and wherein the base defines a cavity that includes a focus lens disposed coaxially with the laser diode.

16. The optical transceiver of claim 15, wherein a monitor photodiode is disposed below a light path that extends from an emission surface of the laser diode, and wherein the light path is aligned with the focus lens such that channel wavelengths emitted from the laser diode intersect with substantially the center of the focus lens.

17. The optical transceiver of claim 13, wherein the base of each of the laser assemblies provides a dual-laser arrangement, wherein the dual-laser arrangement includes first and second laser arrangements disposed opposite each other on the base, and wherein the substrate includes a second mating surface disposed opposite the first mating surface.

18. The optical transceiver of claim 17, wherein the base edge mounts to the first end of the substrate such that each laser assembly mounts to the first end and on to the first and second mating surfaces of the substrate.

19. The optical transceiver of claim 13, wherein the male coupling section includes top and bottom flanges and a vertical section adjoining the top and bottom flanges, and wherein the vertical section is defined at least in part by the first mating surface.

20. The optical transceiver of claim 19, wherein the male coupling section further includes a tapered surface that transitions to the vertical section, the tapered surface allowing the laser assembly to self-align when coupling to an associated groove of a transceiver module.

* * * * *